United States Patent
Lyons et al.

(10) Patent No.: US 6,740,566 B2
(45) Date of Patent: *May 25, 2004

(54) ULTRA-THIN RESIST SHALLOW TRENCH PROCESS USING HIGH SELECTIVITY NITRIDE ETCH

(75) Inventors: Christopher F. Lyons, Fremont, CA (US); Scott A. Bell, San Jose, CA (US); Harry J. Levinson, Saratoga, CA (US); Khanh B. Nguyen, Sunnyvale, CA (US); Fei Wang, San Jose, CA (US); Chih Yuh Yang, San Jose, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/398,641

(22) Filed: Sep. 17, 1999

(65) Prior Publication Data

US 2001/0014512 A1 Aug. 16, 2001

(51) Int. Cl.$^7$ ............... H01L 21/76; H01L 21/8238; H01L 21/336
(52) U.S. Cl. ............... 438/424; 438/221; 438/296
(58) Field of Search ............... 438/221, 296, 438/424

(56) References Cited

U.S. PATENT DOCUMENTS

| | | | | |
|---|---|---|---|---|
| 5,040,020 A | * | 8/1991 | Rauschenbach et al. | |
| 5,518,950 A | * | 5/1996 | Ibok et al. | |
| 5,534,312 A | * | 7/1996 | Hill et al. | |
| 5,688,893 A | * | 11/1997 | Rahman et al. | |
| 5,705,321 A | * | 1/1998 | Brueck et al. | |
| 5,763,315 A | * | 6/1998 | Benedict et al. | |
| 5,786,262 A | | 7/1998 | Jang et al. | |
| 5,817,567 A | | 10/1998 | Jang et al. | |
| 5,930,634 A | * | 7/1999 | Hause et al. | |
| 6,087,706 A | * | 7/2000 | Dawson et al. | |
| 6,107,009 A | * | 8/2000 | Tan | |

FOREIGN PATENT DOCUMENTS

| | | | |
|---|---|---|---|
| JP | 402015650-a | * | 1/1990 |
| JP | 408017907-a | * | 1/1996 |

\* cited by examiner

Primary Examiner—John F. Niebling
Assistant Examiner—Ron Pompey
(74) Attorney, Agent, or Firm—Renner, Otto, Boisselle & Sklar, LLP

(57) ABSTRACT

In one embodiment, the present invention relates to a method of forming a shallow trench, involving the steps of providing a semiconductor substrate comprising a barrier oxide layer over at the semiconductor substrate and a nitride layer over the barrier oxide layer; depositing an ultra-thin photoresist over the nitride layer, the ultra-thin photoresist having a thickness of about 2,000 Å or less; patterning the ultra-thin photoresist to expose a portion of the nitride layer and to define a pattern for the shallow trench; etching the exposed portion of the nitride layer with an etchant having a nitride:photoresist selectivity of at least about 10:1 to expose a portion of the barrier oxide layer; etching the exposed portion of the barrier oxide layer to expose a portion of the semiconductor substrate; and etching the exposed portion of the semiconductor substrate to provide the shallow trench. In another embodiment, the method further involves depositing an insulating filler material into the shallow trench to provide a shallow trench isolation region.

22 Claims, 2 Drawing Sheets

ULTRA-THIN RESIST SHALLOW TRENCH PROCESS USING HIGH SELECTIVITY NITRIDE ETCH

TECHNICAL FIELD

The present invention generally relates to forming shallow trenches. In particular, the present invention relates to forming shallow trenches using an ultra-thin photoresist and a highly selective nitride etch.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller feature sizes are required. This includes the width and spacing of shallow trench isolation regions. Since there are typically numerous shallow trench isolation regions on a semiconductor wafer, the trend toward higher device densities is a notable concern.

Shallow trench isolation (STI) is increasingly popular as a means for electrically isolating devices from one another in integrated circuits. Instead of forming insulating regions around devices through local oxidation of silicon (LOCOS), trenches are etched into the substrate and then filled with insulating material (e.g., $SiO_2$). Trench isolation has become a preferred form of isolation at sub-micron levels because it avoids the problems of unacceptably large encroachment of field oxides into device active regions and surface topography associated with the so-called bird's beak structure of LOCOS.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 μm or less with acceptable resolution is difficult at best, and impossible in some circumstances. Patterning conductive features including shallow trench isolation regions with small dimensions is required in order to participate in the continuing trend toward higher device densities. Procedures that increase resolution, improved critical dimension control, and provide small but effective shallow trench isolation regions are therefore desired.

Lithography employing short wavelength radiation is used to improve resolution. As the wavelength decreases, however, absorbtion of radiation by the photoresist material typically increases. Consequently, the penetration depth of short wavelength radiation into photoresist materials is limited. The limited penetration depth of the shorter wavelength radiation thus requires the use of increasingly thin photoresists so that the radiation can penetrate the entire depth of the photoresist in order to effect adequate patterning thereof. However, the increasing thinness of photoresists results in a decreasingly low etch resistance. The etch protection afforded by thin photoresists is therefore limited, which in turn, limits the lithographic process.

SUMMARY OF THE INVENTION

The present invention provides methods of increasing device density by forming shallow trenches and shallow trench isolation regions with small dimensions. The present invention also provides a highly selective nitride etch that is particularly useful for forming shallow trenches and shallow trench isolation regions when employing ultra-thin photoresists. As a result, the present invention effectively addresses the concerns raised by the trend towards the miniaturization of semiconductor devices.

In one embodiment, the present invention relates to a method of forming a shallow trench, involving the steps of providing a semiconductor substrate comprising a barrier oxide layer over at the semiconductor substrate and a nitride layer over the barrier oxide layer; depositing an ultra-thin photoresist over the nitride layer, the ultra-thin photoresist having a thickness of about 2,000 Å or less; patterning the ultra-thin photoresist to expose a portion of the nitride layer and to define a pattern for the shallow trench; etching the exposed portion of the nitride layer with an etchant having a nitride:photoresist selectivity of at least about 10:1 to expose a portion of the barrier oxide layer; etching the exposed portion of the barrier oxide layer to expose a portion of the semiconductor substrate; and etching the exposed portion of the semiconductor substrate to provide the shallow trench.

In another embodiment, the present invention relates to a method of forming a shallow trench isolation region, involving the steps of providing a semiconductor substrate comprising a barrier oxide layer over at the semiconductor substrate and a nitride layer over the barrier oxide layer; depositing an ultra-thin photoresist over the nitride layer, the ultra-thin photoresist having a thickness of about 2,000 Å or less; patterning the ultra-thin photoresist to expose a portion of the nitride layer and to define a pattern for a shallow trench; etching the exposed portion of the nitride layer with an etchant having a nitride:photoresist selectivity of at least about 10:1 to expose a portion of the barrier oxide layer; etching the exposed portion of the barrier oxide layer to expose a portion of the semiconductor substrate; etching the exposed portion of the semiconductor substrate to provide the shallow trench; and depositing an insulating filler material into the shallow trench to provide the shallow trench isolation region.

In yet another embodiment, the present invention relates to a method of forming a shallow trench isolation region, involving the steps of providing a semiconductor substrate comprising a barrier oxide layer over at the semiconductor substrate and a silicon nitride layer over the barrier oxide layer; depositing an ultra-thin photoresist over the silicon nitride layer, the ultra-thin photoresist having a thickness of about 2,000 Å or less; patterning the ultra-thin photoresist to expose a portion of the silicon nitride layer and to define a pattern for a shallow trench using radiation having a wavelength of about 25 nm or less; etching the exposed portion of the silicon nitride layer with an etchant having a silicon nitride:photoresist selectivity of at least about 12:1 to expose a portion of the barrier oxide layer; etching the exposed portion of the barrier oxide layer to expose a portion of the semiconductor substrate; etching the exposed portion of the semiconductor substrate to provide the shallow trench; and depositing an insulating filler material into the shallow trench to provide the shallow trench isolation region.

DISCLOSURE OF INVENTION

The present invention involves making shallow trenches and shallow trench isolation regions with small dimensions. The present invention more specifically involves making shallow trenches and shallow trench isolation regions with small dimensions in a simple and efficient manner using an ultra-thin photoresist and a highly selective nitride etch step.

Referring to FIGS. 1–9, the present invention is explained in greater detail. Specifically referring to FIG. 1, a substrate 10 is shown having a barrier oxide layer 12 over at least a portion thereof. The substrate is typically a silicon substrate (p-type or n-type) optionally with various elements and/or layers therein and/or thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

The barrier oxide layer 12, in part, prevents or minimizes the interdiffusion of contaminants into the substrate 10. In one embodiment, the barrier oxide layer 12 has a thickness from about 30 Å to about 200 Å, and preferably from about 50 Å to about 150 Å. However, any thickness suitable for minimizing contaminant interdiffusion may be employed.

The barrier oxide layer 12 contains any suitable insulating material. Examples of insulating materials include various metal oxides such as silicon dioxide and silicon oxynitride.

Figure 1:
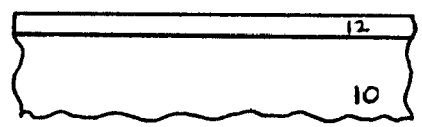
FIG. 1 illustrates in a cross-sectional view the methods of forming a shallow trench isolation region according to several aspects of the present invention.
Figure 2:
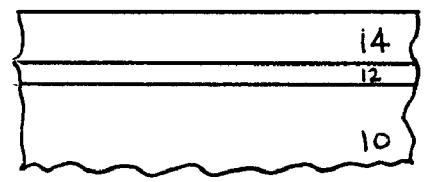
FIG. 2 illustrates in a cross-sectional view the methods of forming a shallow trench isolation region according to several aspects of the present invention.

Referring to FIG. 2, a nitride layer 14 is formed over at least a portion of the barrier oxide layer 12. The nitride layer typically contains silicon nitride. The nitride layer 14 serves as an etch stop layer for patterning the subsequently described ultra-thin photoresist as well as a stop layer for a subsequently described chemical mechanical polishing (CMP) step. The silicon nitride layer can be formed using any suitable technique including chemical vapor deposition (CVD) techniques, such as high density plasma chemical vapor deposition (HDP-CVD), low pressure chemical vapor deposition (LPCVD) or plasma enhanced chemical vapor deposition (PECVD). In one embodiment, silicon nitride is made using a one step PECVD or LPCVD technique such as simultaneously employing gases containing silicon and nitrogen, such as using $SiH_4$ or $SiCl_2H_2$ and $N_2$ or $NH_3$. In this embodiment, the silicon nitride layer is made using LPCVD techniques ($SiCl_2H_2$ and $NH_3$) and contains $Si_3N_4$. Although termed silicon nitride herein, the silicon nitride layer formed in accordance with the present invention may additionally contain hydrogen, especially in embodiments where the silicon nitride layer is made using PECVD techniques, and thus may also be characterized by the chemical formula $Si_xN_yH_z$. In this embodiment, the nitride layer 14 comprises a LPCVD silicon nitride.

The nitride layer 14 has a thickness suitable to function as an etch stop layer for patterning the subsequently described ultra-thin photoresist and a stop layer for a subsequently described CMP step. The nitride layer 14 typically has a thickness from about 500 Å to about 4,000 Å. In another embodiment, the nitride layer 14 has a thickness from about 750 Å to about 3,000 Å. In yet another embodiment, the nitride layer 14 has a thickness from about 1,000 Å to about 2,000 Å.

Figure 3:
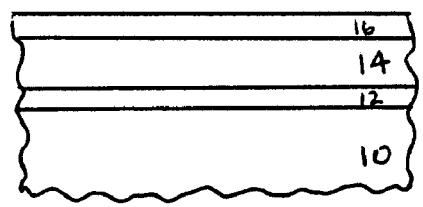
FIG. 3 illustrates in a cross-sectional view the methods of forming a shallow trench isolation region including the use of an ultra-thin photoresist according to several aspects of the present invention.

Referring to FIG. 3, an ultra-thin photoresist layer 16 is formed over at least a portion of the nitride layer 14. The ultra-thin photoresist 16 is deposited over the nitride layer 14 using any suitable technique. For example, the ultra-thin photoresist 16 is deposited using conventional spin-coating or spin casting techniques.

Ultra-thin photoresists in accordance with the present invention have a thickness of about 2,000 Å or less. In one embodiment, the ultra-thin photoresist layer has a thickness from about 500 Å to about 2,000 Å. In another embodiment, the ultra-thin photoresist layer has a thickness from about 600 Å to about 1,750 Å (about 1,750 Å or less). In yet another embodiment, the ultra-thin photoresist layer has a thickness from about 750 Å to about 1,500 Å (about 1,500 Å or less).

The ultra-thin photoresist layer 16 has a thickness suitable for functioning as a mask for etching the underlying nitride layer 14 and for forming patterns or openings in the subsequently developed ultra-thin photoresist layer that are less than about 0.25 µm, about 0.18 µm or less, about 0.15 µm or less, about 0.13 µm or less, about 0.1 µm or less, about 0.075 µm or less, and even 0.05 Åm or less. Since the ultra-thin photoresist layer 16 is relatively thin compared with I-line and other photoresists, improved critical dimension control is realized.

Ultra-thin resists are processed using small wavelength radiation, such as deep UV and extreme UV radiation. As used herein, small wavelength radiation means electromagnetic radiation having a wavelength of about 250 nm or less. In one embodiment, small wavelength radiation includes electromagnetic radiation having a wavelength of about 200 nm or less. In another embodiment, small wavelength radiation includes extreme UV electromagnetic radiation having a wavelength of about 25 nm or less. In yet another embodiment, small wavelength radiation includes extreme UV electromagnetic radiation having a wavelength of about 15 nm or less.

Small wavelength radiation increases precision and thus the ability to improve critical dimension control. Specific examples of wavelengths to which the ultra-thin photoresists are sensitive (undergo chemical transformation enabling subsequent development) include about 248 nm, about 193 nm, about 157 nm, about 13 nm, about 11 nm and about 1 nm. Specific sources of radiation include KrF excimer lasers having a wavelength of about 248 nm, a XeHg vapor lamp having a wavelength from about 200 nm to about 250 nm, mercury-xenon arc lamps having a wavelength of about 248 nm, an ArF excimer laser having a wavelength of about 193 nm, an $F_2$ excimer laser having a wavelength of about 157 nm, extreme UV light having wavelengths of about 13.4 nm and about 11.5 nm, and X-rays having a wavelength of about 1 nm.

In embodiments where the patterns or openings formed in the developed ultra-thin photoresist layer are from about 0.15 µm to about less than 0.25 µm, a 248 nm sensitive photoresist or a 193 nm sensitive photoresist is preferably employed. In embodiments where the patterns or openings formed in the developed ultra-thin photoresist layer are from about 0.1 µm to about 0.15 µm, a 157 nm sensitive photoresist or a 193 nm sensitive photoresist is preferably employed. In embodiments where the patterns or openings formed in the developed ultra-thin photoresist layer are about 0.1 µm or less, a 13 nm sensitive photoresist or an 11 nm sensitive photoresist (extreme UV photoresist) is preferably employed.

Positive or negative ultra-thin photoresists may be employed in the methods of the present invention. An example of a deep UV chemically amplified photoresist is a partially t-butoxycarbonyloxy substituted poly-p-hydroxystyrene. Photoresists are commercially available from a number of sources, including Shipley Company, Kodak, Hoechst Celanese Corporation, and Brewer.

Figure 4:
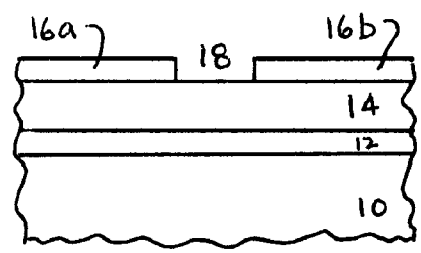
FIG. 4 illustrates in a cross-sectional view the methods of forming a shallow trench isolation region according to several aspects of the present invention.

Referring to FIG. 4, the ultra-thin photoresist layer 16 is exposed to radiation and developed to provide a patterned photoresist 16a and 16b exposing portions of the nitride layer 14. The patterned photoresist 16a and 16b is formed using electromagnetic radiation having a relatively small wavelength (for example, less than 250 nm). In this embodiment, electromagnetic radiation having a wavelength of about 13 nm is employed. Since relatively small wavelengths are used, reflectivity concerns are minimized because larger wavelengths are more frequently associated with reflectivity problems. The ultra-thin photoresist layer 16 is selectively exposed to radiation; that is, selected portions of the ultra-thin photoresist layer 16 are exposed to radiation. Either the exposed or unexposed portions of the ultra-thin photoresist layer 16 are removed or developed to provide the patterned photoresist 16a and 16b.

The size of the width of the exposed portion of the nitride layer 14 corresponds to the opening 18 in the patterned photoresist 16a and 16b, and is less than about 0.25 µm, including about 0.18 µm or less, about 0.15 µm or less, about 0.13 µm or less, about 0.1 µm or less, about 0.09 µm or less, about 0.075 µm or less and about 0.05 µm or less, depending upon the wavelength of radiation employed.

The selectively exposed ultra-thin photoresist layer 16 is developed by contact with a suitable developer that removes either the exposed or unexposed portions of the ultra-thin photoresist layer 16. The identity of the developer depends upon the specific chemical constitution of the ultra-thin photoresist layer 16. For example, an aqueous alkaline solution may be employed to remove unexposed portions of the ultra-thin photoresist layer 16. Alternatively, one or more of dilute aqueous acid solutions, hydroxide solutions, water, and organic solvent solutions may be employed to remove selected portions of the ultra-thin photoresist layer 16. The developer is selected so that it does not degrade or etch the material of the nitride layer 14, or at least degrades or etches the material of the nitride layer 14 at a relatively smaller rate as compared to the rate that the material of the ultra-thin photoresist layer 16 is developed. In other words, the nitride layer 14 serves as an etch-stop layer when developing the ultra-thin photoresist layer 16.

The patterned photoresist 16a and 16b may assume any suitable pattern, but typically the patterned photoresist 16a and 16b corresponds to the desired STI pattern. In the present invention, the patterned photoresist 16a and 16b defines one or more shallow trenches. The patterned photoresist 16a and 16b defines one or more openings 18 over the corresponding nitride layer 14 to the shallow trench(s) subsequently formed and described. The patterned photoresist 16a and 16b serves as an etch mask layer for processing or etching the underlying nitride layer 14.

Figure 5:
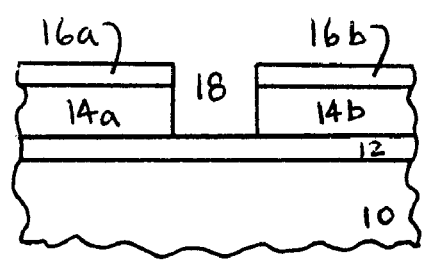
FIG. 5 illustrates in a cross-sectional view the methods of forming a shallow trench isolation region including the use of a selective nitride etch according to several aspects of the present invention.

Referring to FIG. 5, the patterned photoresist 16a and 16b is used as a mask for selectively etching the exposed portions of nitride layer 14 to provide patterned nitride layer 14a and 14b exposing portions of the barrier oxide layer 12. Any suitable etch technique having high selectivity for nitride versus an ultra-thin photoresist may be used to pattern the nitride layer 14.

The etch technique may be used to remove the exposed portions of the nitride layer 14 to provide the patterned nitride layer 14 and continue to define opening 18 exposing portions of the barrier oxide layer 12 under the patterned nitride layer 14a and 14b. The nitride photoresist etch selectivity is at least 10:1. In another embodiment, the nitride:photoresist etch selectivity is at least 12:1. In yet another embodiment, the nitride:photoresist etch selectivity is at least 15:1. The high nitride etch selectivity is required when using an ultra-thin photoresist having a thickness of about 2,000 Å or less due to the extreme thinness of the photoresist.

For example, using the patterned photoresist 16a and 16b as a mask, the silicon nitride layer is selectively etched with an etchant comprising at least one fluorocarbon compound, which is highly selective of the nitride rather than the patterned photoresist 16a and 16b, to form a patterned nitide layer 14a and 14b exposing a portion of the barrier oxide layer 12 through opening 18.

The size of the width of the exposed portion of the barrier oxide layer 12 corresponds to the opening 18 in the patterned photoresist 16a and 16b and patterned nitride layer 14a and 14b, and is less than about 0.25 µm, including about 0.18 µm or less, about 0.15 µm or less, about 0.13 µm or less, about 0.1 µm or less, about 0.09 µm or less, about 0.075 µm or less and about 0.05 µm or less, depending upon the wavelength of radiation employed.

Examples of fluorocarbon compounds include compounds containing at least atom of carbon and at least one atom of fluorine and include one or more of $CH_3F$, $C_2F_6$, $CF_4$ and $CHF_3$, may be employed. In one embodiment, the nitride etch process further employs a carrier gas with the fluorocarbon compound. Carrier gases are non-reactive gases and generally include gases of the noble elements. Examples of carrier gases include He, Ne, Ar, Kr, Xe and combinations thereof. In one embodiment, an oxygen containing gas such as $O_2$ is not employed with the fluorocarbon compound. In a preferred embodiment, the nitride layer 14 is etched using an anisotropic etching process, such as dry a etching technique. In another preferred embodiment, reactive ion etching is employed. In this embodiment, an anisotropic etch using $CF_4$ and $CHF_3$ is employed where s nitride:photoresist etch selectivity over about 15 is achieved.

Figure 6:
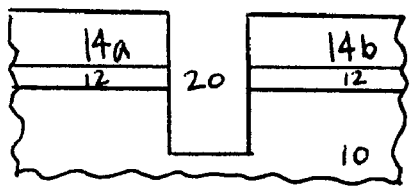
FIG. 6 illustrates in a cross-sectional view the methods of forming a shallow trench isolation region according to several aspects of the present invention.

Referring to FIG. 6, the barrier oxide layer 12 and the substrate 10 are etched to complete the formation of a shallow trench 20. Any suitable etch technique may be employed to remove the exposed portions of the barrier oxide layer 12 and a portion of the exposed substrate 10. In this connection, the patterned nitride layer 14a and 14b serves as a hard mask while the exposed portion of the barrier oxide layer 12 and a portion of the underlying portion of the substrate 10 are suitably etched. The substrate is etched to a depth suitable to provide insulation properties to the newly formed isolated regions of the substrate. Before, during or after the formation of a shallow trench 20, the patterned photoresist 16a and 16b is stripped using suitable ashing techniques or using the barrier oxide layer and/or substrate etch materials.

In one embodiment, the depth of the shallow trench 20 within the substrate 10 (not including within the barrier oxide layer 12 and the nitride layer 14) is from about 300 Å to about 10,000 Å. In another embodiment, the depth of the shallow trench 20 within the substrate 10 is from about 500 Å to about 7,500 Å. In yet another embodiment, the depth of the shallow trench 20 within the substrate 10 is from about 1,000 Å to about 5,000 Å.

In one embodiment, the width of the shallow trench 20 within the substrate 10 is less than about 2,500 Å. In another embodiment, the width of the shallow trench 20 within the substrate 10 is about 1,800 Å or less. In yet another embodiment, the width of the shallow trench 20 within the substrate 10 is about 1,500 Å or less. In still yet other embodiments, the width of the shallow trench 20 within the substrate 10 is about 1,300 Å or less, about 1,000 Å or less, about 900 Å or less, about 750 Å or less, and even about 500 Å or less.

Figure 7:
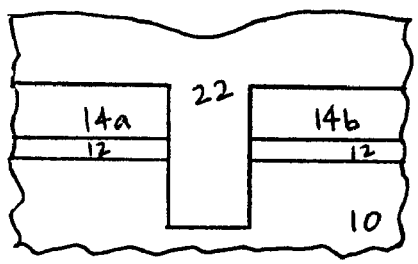
FIG. 7 illustrates in a cross-sectional view the methods of forming a shallow trench isolation region according to several aspects of the present invention.

Referring to FIG. 7, an insulating filler material 22 is deposited into the shallow trench 20, and optionally/typically over the entire structure so as to fill the shallow trench 20. Insulating filler materials include one or more oxide materials, such as metal oxides including silicon dioxide and silicon oxynitride, oxide glasses, and low K polymer materials. Low K polymer materials are materials having low dielectric constants and include polyimides, fluorinated polyimides, polytetrafluoroethylene, polysilsequioxane, benzocyclobutene (BCB), parlene F, parlene N and amorphous polytetrafluoroethylene. A specific example of a commercially available low K polymer material is Flare™ from AlliedSignal believed to be derived from perfluorobiphenyl and aromatic bisphenols. Oxide glasses include fluorine doped silicon glass (FSG), tetraethylorthosilicate (TEOS), phosphosilicate glass (PSG), borophosphosilicate glass (BPSG), any other suitable spin-on glass. In this embodiment, the insulating filler material 22 comprises silicon dioxide. The filled shallow trench serves as an insulating boundary between devices within the divided substrate regions. The insulating filler material 22 is deposited using any suitable technique including CVD techniques and spin-coating techniques.

Figure 8:
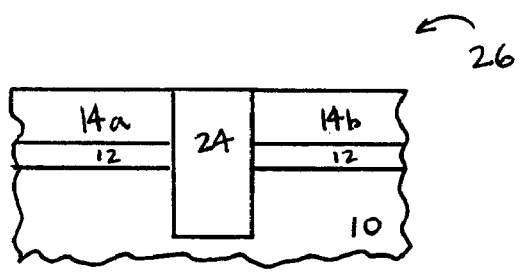
FIG. 8 illustrates in a cross-sectional view the methods of forming a shallow trench isolation region including a planarization step according to several aspects of the present invention.
Figure 9:
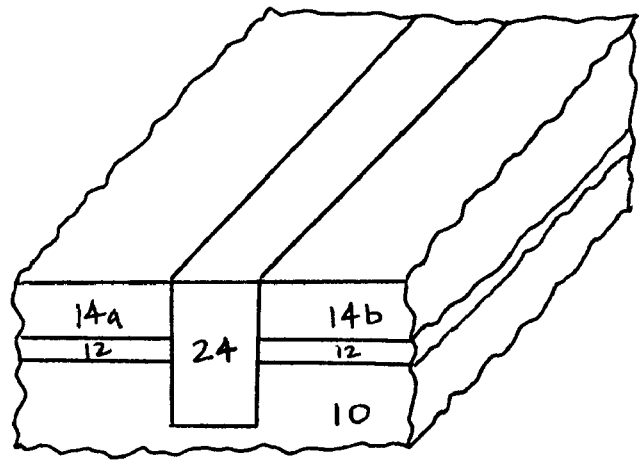
FIG. 9 is a perspective illustration of the shallow trench isolation region of FIG. 8.

Referring to FIG. 8, a CMP step is performed to remove a portion of the insulating filler material 22 (portions of the insulating filler material 22 not located in the shallow trench 20) and to planarize the insulating filler material 22 with the patterned nitride layer 14a and 14b so as to result in a shallow trench isolation region 24 included within the shallow trench structure 26 shown in FIGS. 8 and 9. FIG. 9 shows another perspective of the shallow trench structure 26 of FIG. 8. Thereafter, standard STI process steps are performed to finalize the ultimately desired shallow trench isolation.

Thus the present invention provides for a method of fabricating a shallow trench isolation structure wherein the shallow trench isolation regions 24 have widths below about the 0.25 µm level, including about 0.18 µm or less, about 0.15 µm or less, about 0.13 µm or less, about 0.1 µm or less, about 0.09 µm or less, about 0.075 µm or less and about 0.05 µm or less. The shallow trench isolation regions 24 separate substrate regions 28 and 30 which may contain or support different devices of an integrated circuit, for example.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a shallow trench, comprising:
   providing a semiconductor substrate with a barrier oxide layer over at least a portion of the semiconductor substrate, and a nitride layer over the barrier oxide layer;
   depositing an ultra-thin photoresist over the nitride layer, the ultra-thin photoresist having a thickness of about 2,000 Å or less;
   patterning the ultra-thin photoresist to expose a portion of the nitride layer and to define a pattern for the shallow trench;
   etching the exposed portion of the nitride layer with an etchant having a nitride:photoresist selectivity of at least about 10:1 to expose a portion of the barrier oxide layer;
   etching the exposed portion of the barrier oxide layer to expose a portion of the semiconductor substrate; and
   etching the exposed portion of the semiconductor substrate to provide the shallow trench wherein the shallow trench has a width of less than 0.1 µm.

2. The method of claim 1, wherein the nitride layer comprises silicon nitride.

3. The method of claim 1, wherein patterning the ultra-thin photoresist involves exposing the ultra-thin photoresist to radiation having a wavelength of about 250 nm or less and developing the exposed ultra-thin photoresist with a developer.

4. The method of claim 1, wherein the ultra-thin photoresist comprises a deep UV photoresist material or an extreme UV photoresist material.

5. The method of claim 1, wherein the nitride layer etchant comprises at least one fluorocarbon compound.

6. The method of claim 1, wherein the shallow trench has a width of less than about 0.25 µm.

7. The method of claim 1, wherein the shallow trench has a depth within the semiconductor substrate from about 300 Å to about 10,000 Å.

8. A method of forming a shallow trench isolation region, comprising:

providing a semiconductor substrate with a barrier oxide layer over at least a portion of the semiconductor substrate, and a nitride layer over the barrier oxide layer;

depositing an ultra-thin photoresist over the nitride layer, the ultra-thin photoresist having a thickness of about 2,000 Å or less;

patterning the ultra-thin photoresist to expose a portion of the nitride layer and to define a pattern for a shallow trench;

etching the exposed portion of the nitride layer with an etchant having a nitride:photoresist selectivity of at least about 10:1 to expose a portion of the barrier oxide layer;

etching the exposed portion of the barrier oxide layer to expose a portion of the semiconductor substrate;

etching the exposed portion of the semiconductor substrate to provide the shallow trench; and depositing an insulating filler material into the shallow trench to provide the shallow trench isolation region wherein the shallow trench has a width of less than 0.1 µm.

9. The method of claim 8, wherein the ultra-thin photoresist has a thickness of about 1,500 Å or less.

10. The method of claim 8, wherein patterning the ultra-thin photoresist involves exposing the ultra-thin photoresist to radiation having a wavelength of about 200 nm or less and developing the exposed ultra-thin photoresist with a developer.

11. The method of claim 8, wherein the nitride layer etchant has a nitride:photoresist selectivity of at least about 15:1.

12. The method of claim 8, wherein the nitride layer etchant comprises at least one of $CH_3F$, $C_2F_6$, $CF_4$ and $CHF_3$.

13. The method of claim 12, wherein the nitride layer etchant further comprises at least one of He, Ne, Ar, Kr, and Xe.

14. The method of claim 8, wherein the insulating filler material comprises at least one of silicon dioxide, silicon oxynitride, polyimides, fluorinated polyimides, polytetrafluoroethylene, polysilsequioxane, benzocyclobutene, parlene F, parlene N, amorphous polytetrafluoroethylene, fluorine doped silicon glass, tetraethylorthosilicate, phosphosilicate glass, and borophosphosilicate glass.

15. A method of forming a shallow trench isolation region, comprising:

providing a semiconductor substrate with a barrier oxide layer over at least a portion of the semiconductor substrate, and a nitride layer over the barrier oxide layer;

depositing an ultra-thin photoresist over the silicon nitride layer, the ultra-thin photoresist having a thickness of about 2,000 Å or less;

patterning the ultra-thin photoresist to expose a portion of the silicon nitride layer and to define a pattern for a shallow trench using radiation having a wavelength of about 25 nm or less;

etching the exposed portion of the silicon nitride layer with an etchant having a silicon nitride:photoresist selectivity of at least about 12:1 expose a portion of the barrier oxide layer;

etching the exposed portion of the barrier oxide layer to expose a portion of the semiconductor substrate;

etching the exposed portion of the semiconductor substrate to provide the shallow trench; and depositing an insulating filler material into the shallow trench to provide the shallow trench isolation region wherein the shallow trench has a width of less than 0.1 µm.

16. The method of claim 15, wherein patterning the ultra-thin photoresist involves exposing the ultra-thin photoresist to radiation having at least one wavelength of about 13 nm and about 11 nm, and developing the exposed ultra-thin photoresist with a developer.

17. The method of claim 15, wherein the silicon nitride layer etchant comprises at least one of $CF_4$ and $CHF_3$.

18. The method of claim 15, further comprising chemical mechanical polishing the insulating filler material to the level of the silicon nitride layer.

19. The method of claim 15, wherein the insulating filler material comprises at least one of silicon dioxide, a low K polymer material and an oxide glass.

20. The method of claim 15, wherein the shallow trench isolation region has a width of about 0.1 µm or less.

21. The method of claim 8, wherein the depositing the filler material includes depositing by chemical vapor deposition.

22. The method of claim 15, wherein the depositing the filler material includes depositing by chemical vapor deposition.

* * * * *

UNITED STATES PATENT AND TRADEMARK OFFICE
CERTIFICATE OF CORRECTION

PATENT NO. : 6,740,566 B2
DATED : May 25, 2004
INVENTOR(S) : Lyons et al.

It is certified that error appears in the above-identified patent and that said Letters Patent is hereby corrected as shown below:

Column 4,
Line 59, replace "Å" with -- $\mu$ --.

Column 6,
Line 38, replace "nitride photoresist" with -- nitride:photoresist --.

Column 9,
Lines 6-7, remove, claim 6.

Column 10,
Lines 45-46, remove, claim 20.

Signed and Sealed this

Twentieth Day of July, 2004

JON W. DUDAS
*Acting Director of the United States Patent and Trademark Office*